(12) United States Patent
Chen et al.

(10) Patent No.: US 12,520,571 B2
(45) Date of Patent: Jan. 6, 2026

(54) SEMICONDUCTOR STRUCTURE INCLUDING 3D CAPACITOR AND METHOD FOR FORMING THE SAME

(71) Applicant: TAIWAN SEMICONDUCTOR MANUFACTURING COMPANY LTD., Hsinchu (TW)

(72) Inventors: Yi-Ting Chen, New Taipei (TW); Sung-Hsin Yang, Tainan (TW); Chen-Chieh Chiang, Kaohsiung (TW); Jung-Chi Jeng, Tainan (TW); Ling-Sung Wang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 456 days.

(21) Appl. No.: 18/162,691

(22) Filed: Jan. 31, 2023

(65) Prior Publication Data

US 2024/0258304 A1 Aug. 1, 2024

(51) Int. Cl.
| | | |
|---|---|---|
| *H10D 84/80* | (2025.01) | |
| *H01L 21/265* | (2006.01) | |
| *H01L 21/308* | (2006.01) | |
| *H10D 84/01* | (2025.01) | |
| *H10D 84/03* | (2025.01) | |
| *H01L 21/266* | (2006.01) | |

(52) U.S. Cl.
CPC ..... *H10D 84/811* (2025.01); *H01L 21/26513* (2013.01); *H01L 21/3086* (2013.01); *H10D 84/0158* (2025.01); *H10D 84/038* (2025.01); *H01L 21/266* (2013.01)

(58) Field of Classification Search
CPC ............. H01L 21/26513; H01L 21/266; H01L 21/3086; H10D 1/60; H10D 1/66; H10D 1/714; H10D 30/01; H10D 30/019–0198; H10D 30/024; H10D 30/0241; H10D 30/501–509; H10D 30/62; H10D 84/01; H10D 84/0158; H10D 84/038; H10D 84/811; H10D 84/813; H10D 84/817; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839; H10D 84/834
See application file for complete search history.

(56) References Cited

U.S. PATENT DOCUMENTS

2013/0244392 A1\* 9/2013 Oh ..................... H10D 84/0193
438/299

\* cited by examiner

*Primary Examiner* — Cheung Lee
(74) *Attorney, Agent, or Firm* — WPAT LAW; Anthony King

(57) ABSTRACT

A method for forming a semiconductor structure includes following operations. First fins are formed in a first region of a substrate, and second fins are formed in a second region of the substrate. Widths of the first fins are greater than widths of the second fins. An isolation structure is formed over the substrate. A first ion implantation is performed on the first fins. A portion of the isolation structure is removed to expose a portion of each first fin and a portion of each second fin. The widths of the first fins are equal to or less than the widths of the second fins after the removing of the portion of the isolation structure. A 3D capacitor is formed in the first region, and a FinFET device is formed in the second region. The 3D capacitor includes the first fins, and the FinFET device includes the second fins.

20 Claims, 12 Drawing Sheets

SEMICONDUCTOR STRUCTURE INCLUDING 3D CAPACITOR AND METHOD FOR FORMING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the size of the smallest component (or line) that can be created using a fabrication process) has decreased. This scaling down process generally provides benefits by increasing production efficiency and lowering associated costs. Such scaling down has also increased the complexity of processing and manufacturing ICs, and for these advances to be realized, similar developments in IC manufacturing are needed.

For example, as the semiconductor industry has progressed into nanometer technology process nodes in pursuit of greater device density, higher performance, and lower costs, challenges fin both fabrication and design have resulted in the development of three-dimensional (3D) devices. To facilitate the development of 3D devices, there is a need for capacitors for the 3D devices. Accordingly, although existing capacitors and methods of fabricating capacitors have been generally adequate for their intended purposes, they have not been entirely satisfactory in all respects. Therefore, further development in 3D capacitor are needed.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
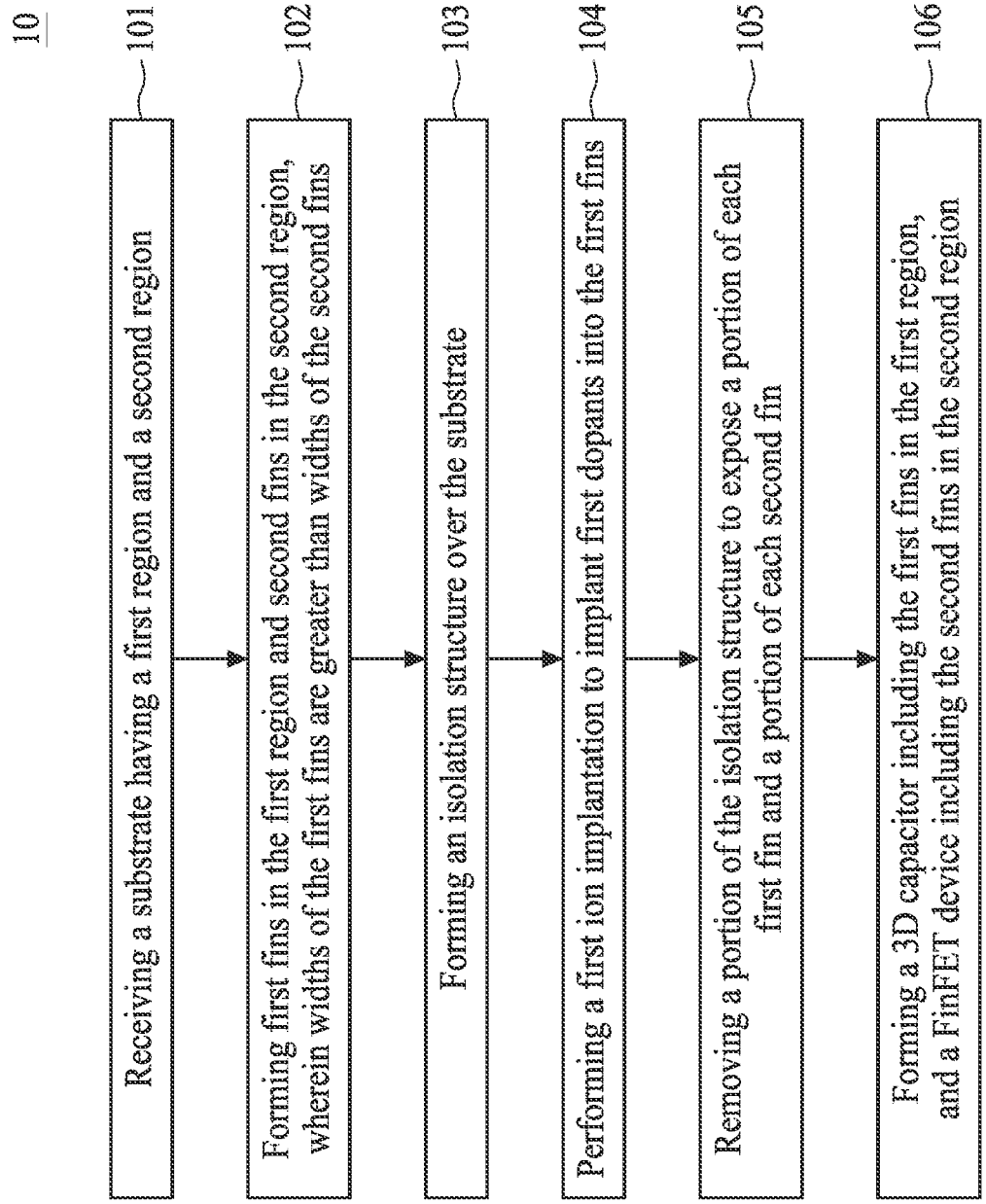
FIG. 1 is a flowchart representing a method for forming a semiconductor structure including a 3D capacitor according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Fin field-effect transistor (FinFET) device have particular importance in the development of 3D IC devices. FinFETs are fabricated with a in structure extending vertically from a substrate, with a gate formed over the fin.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some comparative approaches, a semiconductor structure including FinFET devices may have fins of a same dimension.

When 3D capacitors are integrated in the FinFET devices, challenges arise due to the fins having the same dimension. For example, dopants are heavily doped into the fins to increase capacitance of the 3D capacitors, causing the heavily-doped fins to exhibit a greater etching rate, resulting in a high consumption rate during subsequent operations such as isolation recessing. A width mismatch issue between the FinFET device and the 3D capacitor therefore arises. Further, it has been observed that a dielectric layer, which is formed over the consumed fins and serves as an insulator between electrodes of the 3D capacitor, may suffer from an inconsistent or uneven thickness.

Aspects of the present invention provides a design for a 3D capacitor. The 3D capacitor may be a metal-insulator-metal (MIM) 3D capacitor or a metal-insulator-semiconductor (MIS) 3D capacitor. The 3D capacitor, for example, may be used in conjunction with a 3D device such as a FinFET device. The FinFET device may be, for example, a P-type metal-oxide-semiconductor (PMOS) FinFET device or an N-type metal-oxide-semiconductor (NMOS) FinFET device. The present disclosure depicts an MIS capacitor as an example of a FinFET device to illustrate various embodiments of the present disclosure. It should be understood, however, that the disclosure is not intended to be limited to a particular type of device, except as specifically claimed.

The present disclosure therefore provides a semiconductor structure including a 3D capacitor and a FinFET device, and a method for manufacturing a 3D capacitor and a FinFET device. In some embodiments, the semiconductor structure includes fins having different widths for forming the 3D capacitor and the FinFET device. In some embodiments, a width of the fin for forming the 3D capacitor is greater than a width of the fin for forming the FinFET device in some stages in the manufacturing operations. Accordingly, a rate of consumption of the fin of the 3D capacitor during the manufacturing operation is compensated by the fin's width. Due to the compensation of the width of the fins of the 3D capacitor, capacitance of the 3D capacitor is increased without impacting performance of the FinFET device. Further, the method provided by the present disclosure can be easily integrated in FinFET approaches to the front-end-of-line (FEOL) manufacturing operations.

FIG. 1 is a flowchart representing a method for forming a semiconductor structure including a 3D capacitor 10 according to aspects of the present disclosure. The method 10 includes a number of operations (101, 102, 103, 104, 105 and 106). The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may be only briefly described herein. Thus, other implementations are possible within the scope of the various aspects described herein.

Figure 2:
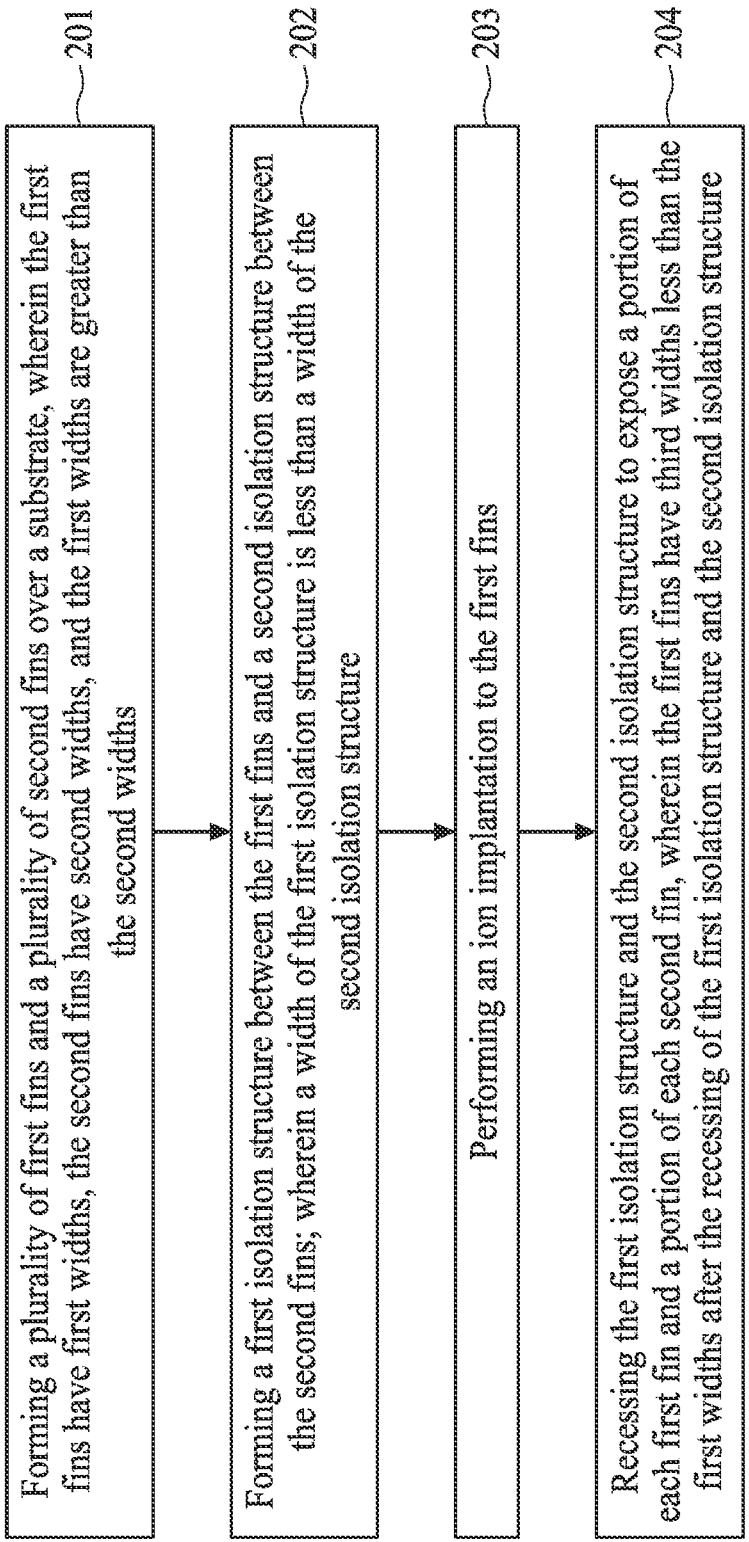
FIG. 2 is a flowchart representing a method for forming a semiconductor structure including fins according to aspects of the present disclosure.

FIG. 2 is a flowchart representing a method for forming a semiconductor structure including fins 20 according to aspects of the present disclosure. The method 20 includes a number of operations (201, 202, 203 and 204). The method 20 will be further described according to one or more embodiments. It should be noted that the operations of the method 20 may be rearranged or otherwise modified within the scope of the various aspects. It should be further noted that additional processes may be provided before, during, and after the method 20, and that some other processes may be only briefly described herein. Thus, other implementations are possible within the scope of the various aspects described herein. In some embodiments, the method 20 can be integrated into the method 10, but the disclosure is not limited thereto.

Figure 3:
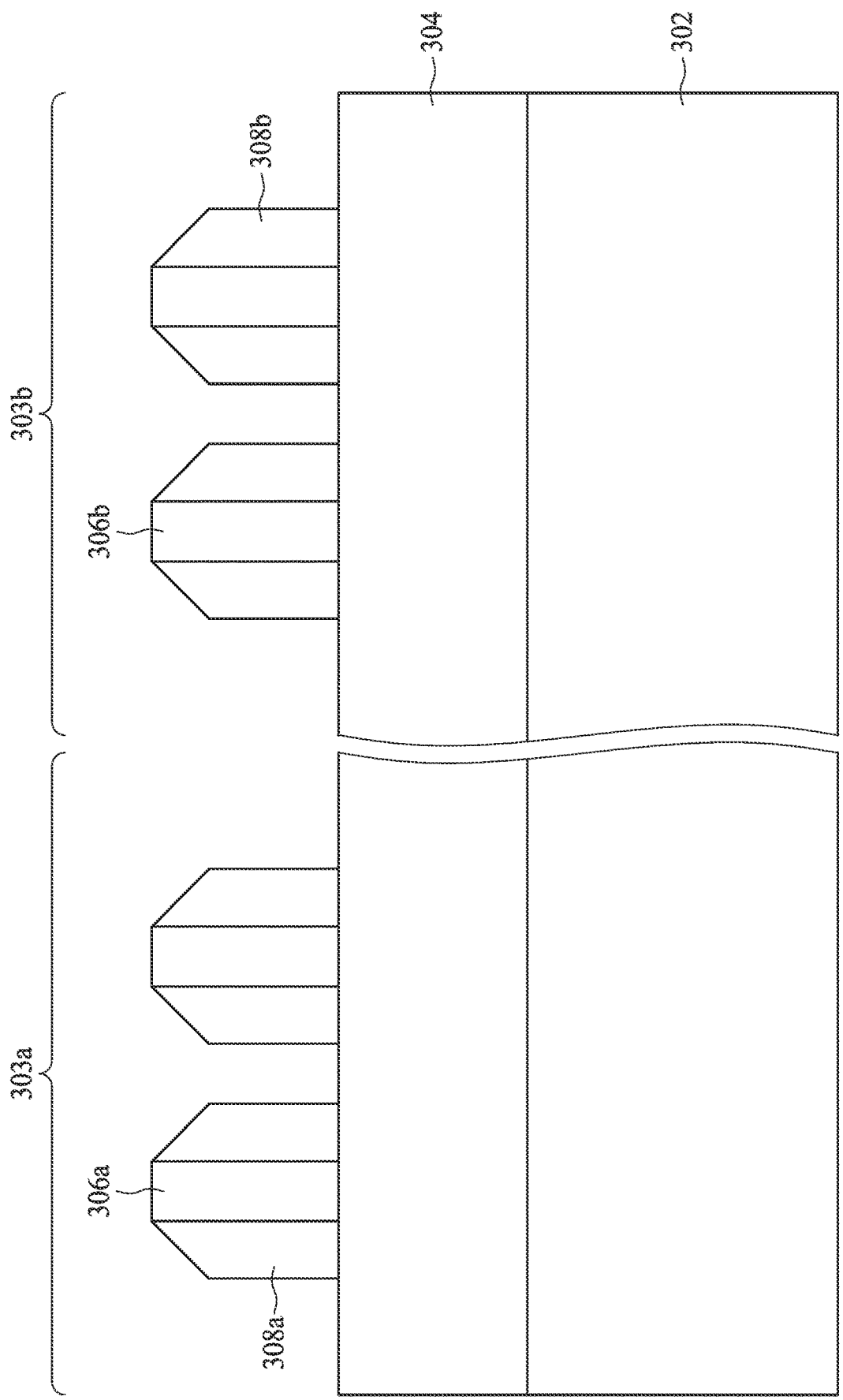
FIGS. 3 to 12 are cross-sectional views of a semiconductor structure including a 3D capacitor at various fabrication stages according to aspects of the present disclosure in one or more embodiments.

Referring to FIG. 3, in some embodiments, in operation 101, a substrate 302 is received. In some embodiments, the substrate 302 is a bulk silicon substrate. In other embodiments, the substrate 302 includes an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or a combination thereof. In still other embodiments, the substrate 302 includes a silicon-on-insulator (SOI) substrate. The SOI substrate can be fabricated using separation by ion implantation of oxygen (SIMOX), wafer bonding, and/or other suitable methods.

The substrate 302 may have a first region 303a and a second region 303b defined thereon. In some embodiments, the first region 303a is used to accommodate a 3D capacitor while the second region 303b is used to accommodate a logic device such as a FinFET device, but the disclosure is not limited thereto. In some embodiments, the first region 303a may be defined as a peripheral region, and the second region 303b may be defined as a central region. The first region 303a and the second region 303b can be defined according to different circuit designs or product designs.

In some embodiments, a hard mask structure 304 can be formed over a surface of the substrate 302. The hard mask structure 304 may be a multilayered structure, but the disclosure is not limited thereto. In some embodiments, the hard mask structure 304 is formed by any suitable process to any suitable thickness. The hard mask structure 304 may include a material such as silicon nitride, silicon oxynitride, silicon carbide, silicon carbon nitride, other suitable material, or a combination thereof. In the present embodiments, the hard mask structure 304 includes silicon nitride and is formed by a chemical vapor deposition (CVD) process. In various examples, the silicon nitride can be formed by physical vapor deposition (PVD), atomic layer deposition (ALD), high density plasma CVD (HDPCVD), other suitable methods, and/or combinations thereof. The CVD process may use, for example, chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

In some embodiments, other layer(s) may be formed between the hard mask structure 304 and the substrate 302. For example, a pad layer (not shown) may be formed prior to the forming of the hard mask structure 304. The pad layer is formed by any suitable process to any suitable thickness. In some embodiments, the pad layer includes silicon oxide and is formed by a CVD or a thermal oxidation process. The thermal oxidation process may be a dry or a wet process. In various examples, the silicon oxide can be formed by PVD, ALD, HDPCVD, other suitable methods, and/or a combination thereof.

In operation 102, a plurality of first fins 310a are formed in the first region 303a and a plurality of second fins 310b are formed in the second region 303b. In some embodiments, operation 201 is similar to operation 102. Further, widths of the first fins 310a are greater than widths of the second fins 310b. In some embodiments, operation 102 and operation 201 respectively include further operations.

Still referring to FIG. 3, in some embodiments, a first mandrel 306a is formed in the first region 303a and a second mandrel 306b is formed in the second region 303b. In some embodiments, a width of the first mandrel 306a is equal to a width of the second mandrel 306b. In some alternative embodiments, the width of the first mandrel 306a is different from the width of the second mandrel 306b. The widths of the first and second mandrels 306a and 306b can be adjusted such that a pitch of the to-be-formed first fin 310a and a pitch of the to-be-formed second fin 310b are substantially equal. The first and second mandrels 306a and 306b include materials that are different from that of the hard mask structure 304 to achieve etching selectivity during an etching process, such that the hard mask structure 304 can be selectively etched with minimal (or no) during the forming of the first and second mandrels 306a and 306b. In some embodiments, the first and second mandrels 306a and 306b include a semiconductor material and/or a dielectric material that achieves a desired etching selectivity, such as silicon, amorphous silicon, silicon oxide, silicon nitride, silicon oxynitride, silicon carbide, another suitable material, or a combination thereof.

Still referring to FIG. 3, first spacers 308a are formed over sidewalls of the first mandrel 306a in the first region 303a, and second spacers 308b are formed over sidewalls of the second mandrel 306b in the second region 303b. The first and second spacers 308a and 308b may include a same material, but the disclosure is not limited thereto. The first and second spacers 308a and 308b include one or more materials different from the materials of the first and second mandrels 306a and 306b. In some embodiments, the first and second spacers 308a and 308b may include a dielectric material. The first and second spacers 308a and 308b can be formed by various processes, including a deposition process and an etching process. For example, the deposition process may include a CVD process or a PVD process. For example, the etching process may include an anisotropic etch such as a plasma etch. In the present embodiment, the first and second spacers 308a and 308b are formed by same operations. Further, widths of the first spacers 308a and widths of the second spacers 308b are equal.

Figure 4:
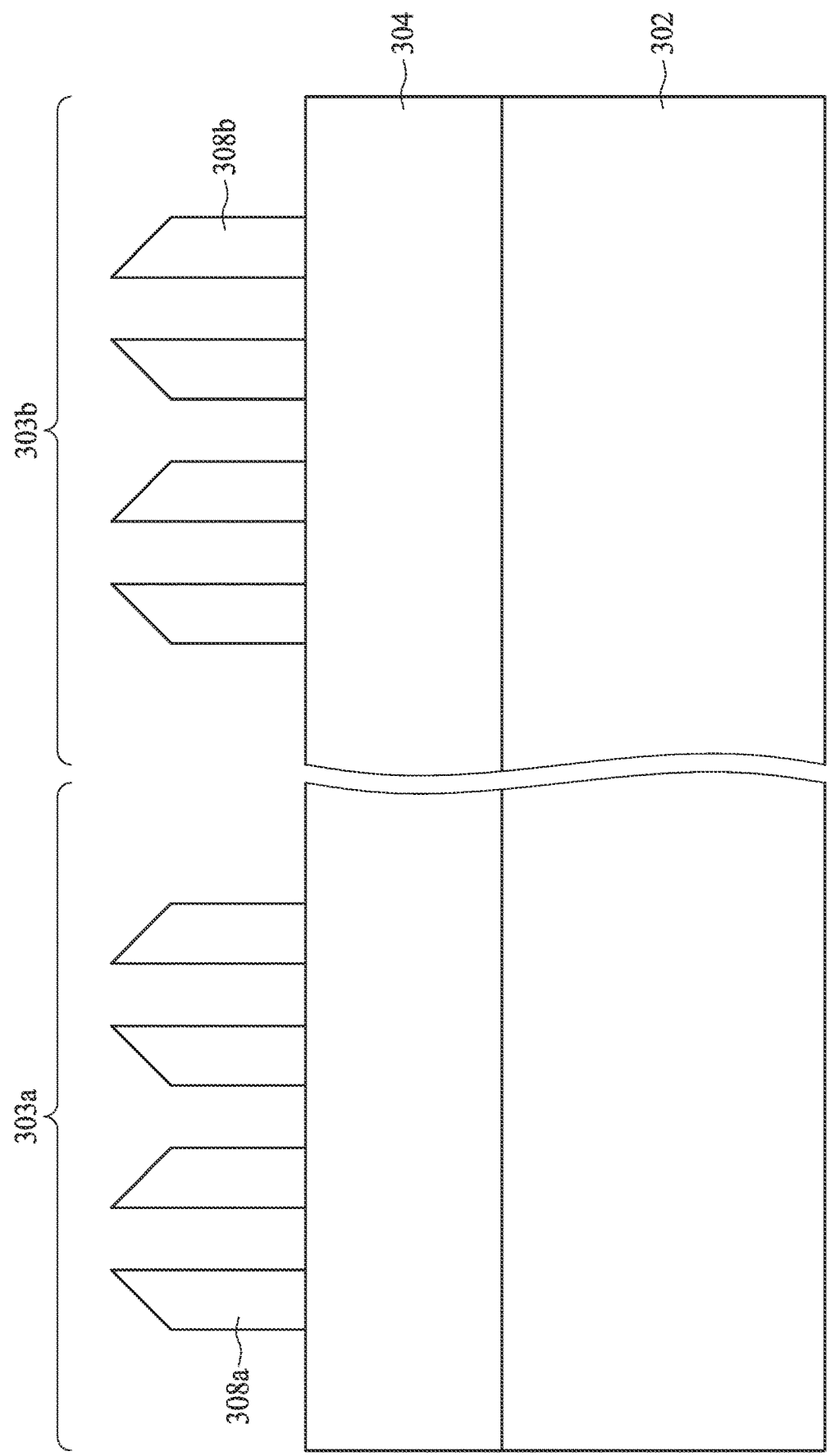

Referring to FIG. 4, the first and second mandrels 306a and 306b are removed by an etching process. As shown in FIG. 4, the first and second spacers 308a and 308b remain standing over the hard mask structure 304 after the first and second mandrels 306a and 306b are removed. The etching process can be a wet etching, a dry etching, or a combination thereof.

Figure 5:
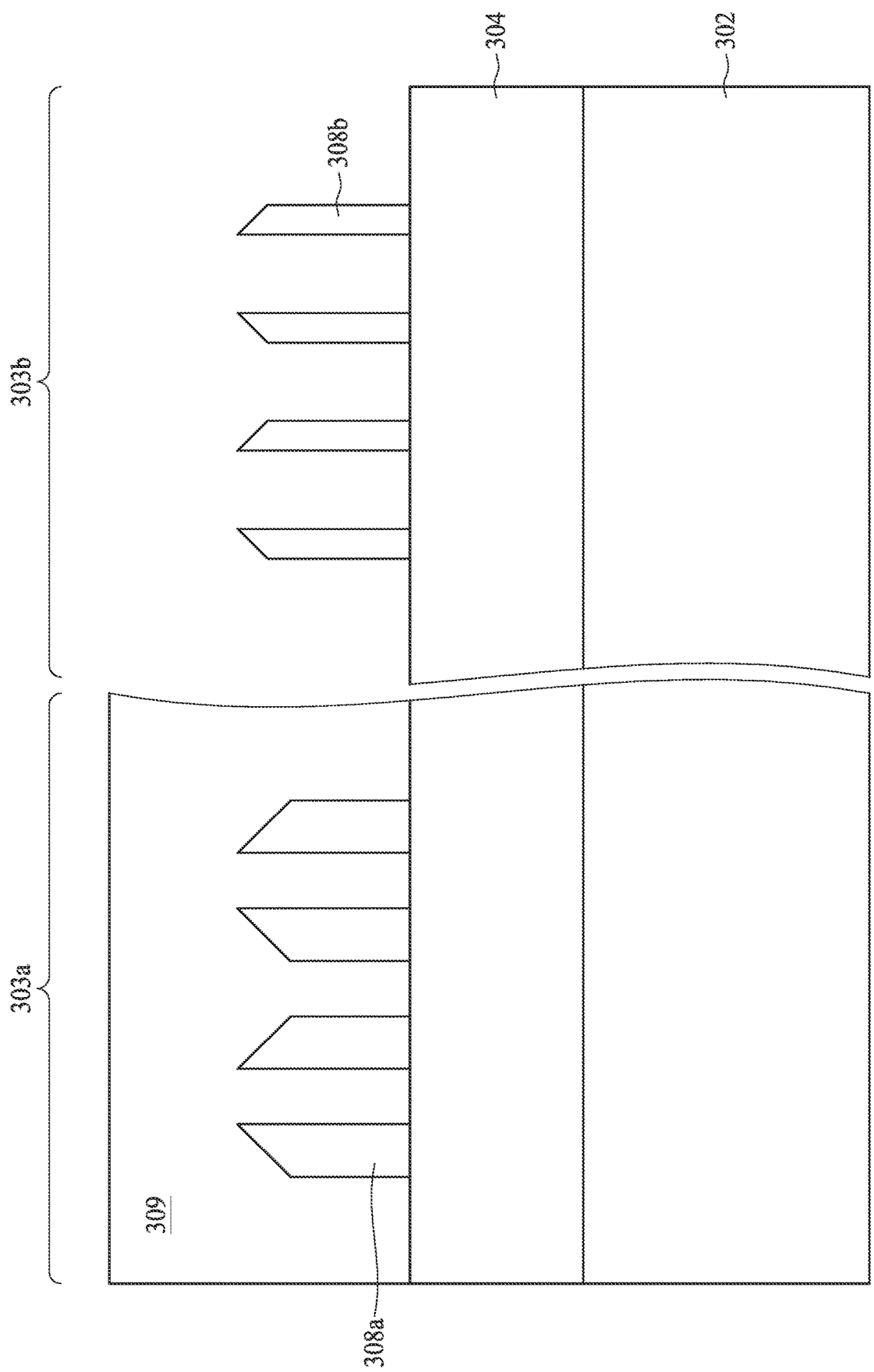

Referring to FIG. 5, in some embodiments, a protection layer 309 is formed over the substrate 302 in the first region 303a. Further, the protection layer 309 covers the first spacers 308a entirely. In such embodiments, a trimming operation is performed after the forming of the protection layer 309. The trimming operation may include an etching that decreases the widths of the second spacers 308b, as shown in FIG. 5. Additionally, heights of the second spacers 208b may be reduced. In such embodiments, the trimming operation causes the second spacers 308b to have decreased widths, and as such, a thinner fin as described below.

Figure 6:
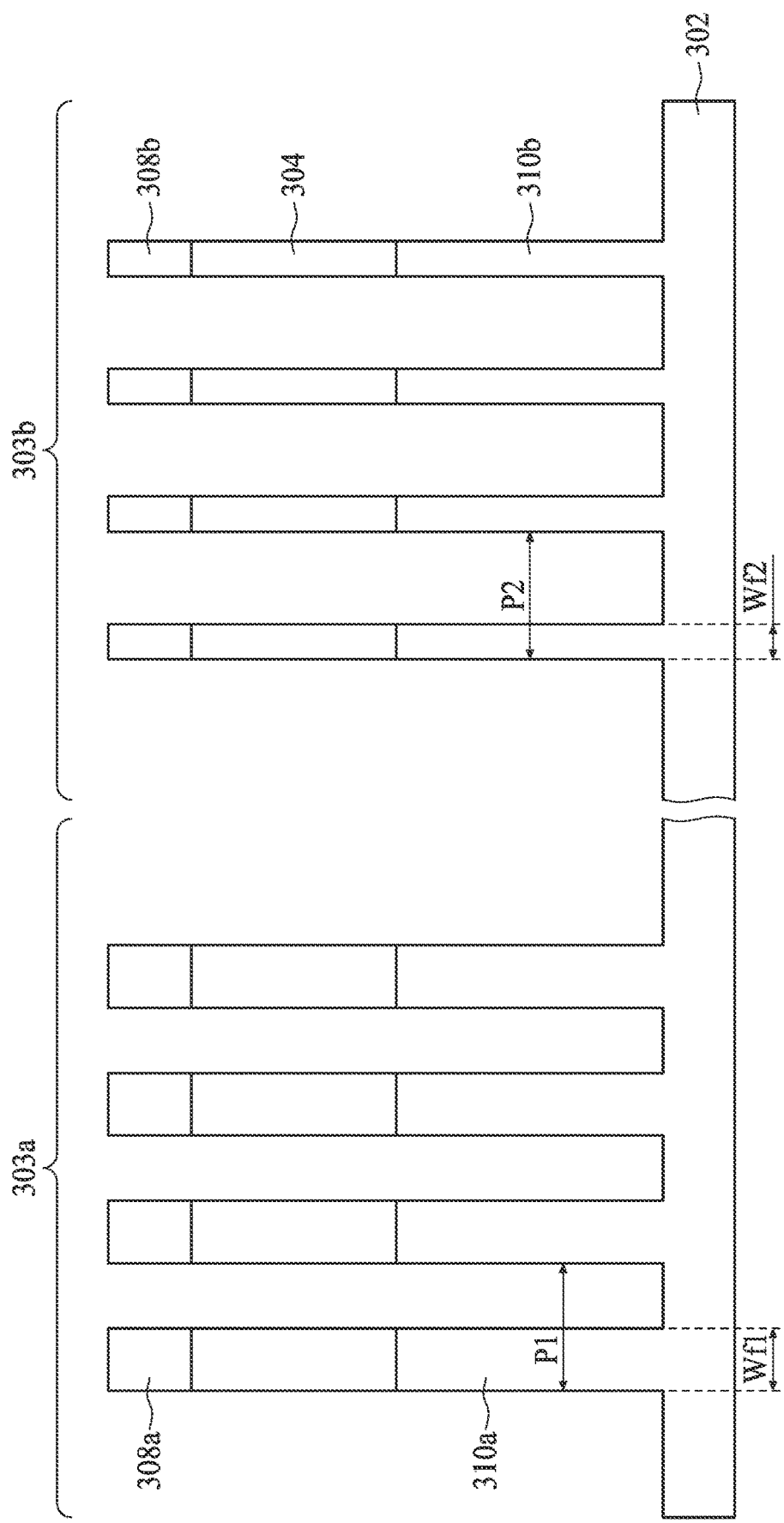

Referring to FIG. 6, the first and second spacers 308a and 308b are used as a masking structure to form the first fins 310a in the first region 303a and the second fins 310b in the second region 303b. The first and second fins 310a and 310b may be formed by sequentially etching the layers formed on the substrate 302 by, for example, anisotropic etching processes. Suitable anisotropic etching processes include plasma etching, reactive ion etching (RIE), ion beam etching, and other suitable techniques. The etchings may be conducted in-situ. For example, the etching of one or more layers and/or the substrate 302 may occur in a same processing chamber without intervening processes.

As shown in FIG. 6, the first fins 310a have same heights, and the second fins 310b have same heights. In some embodiments, the heights of the first fins 310a and the heights of the second fins 310b are substantially equal to each other, but the disclosure is not limited thereto. In some embodiments, the first fins 310a have same widths Wf1, and the second fins 310b have same widths Wf2. Further, the widths Wf1 of the first fins 310a are greater than the widths Wf2 of the second fins 310b. A ratio of the widths Wf1 of the first fins 310a to the widths Wf2 of the second fins 310b is between approximately 1.1 and approximately 2. It should be noted that the first fins 310a have a pitch P1, and the second fins 310b have a pitch P2. The pitch is a dimension from an edge of one fin to the same edge of an adjacent fin. It should be noted that although the widths Wf1 of the first fins 310a are greater than the widths Wf2 of the second fins 310b, the pitch P1 of the first fins 310a is similar to the pitch P2 of the second fins 310b.

Figure 7:
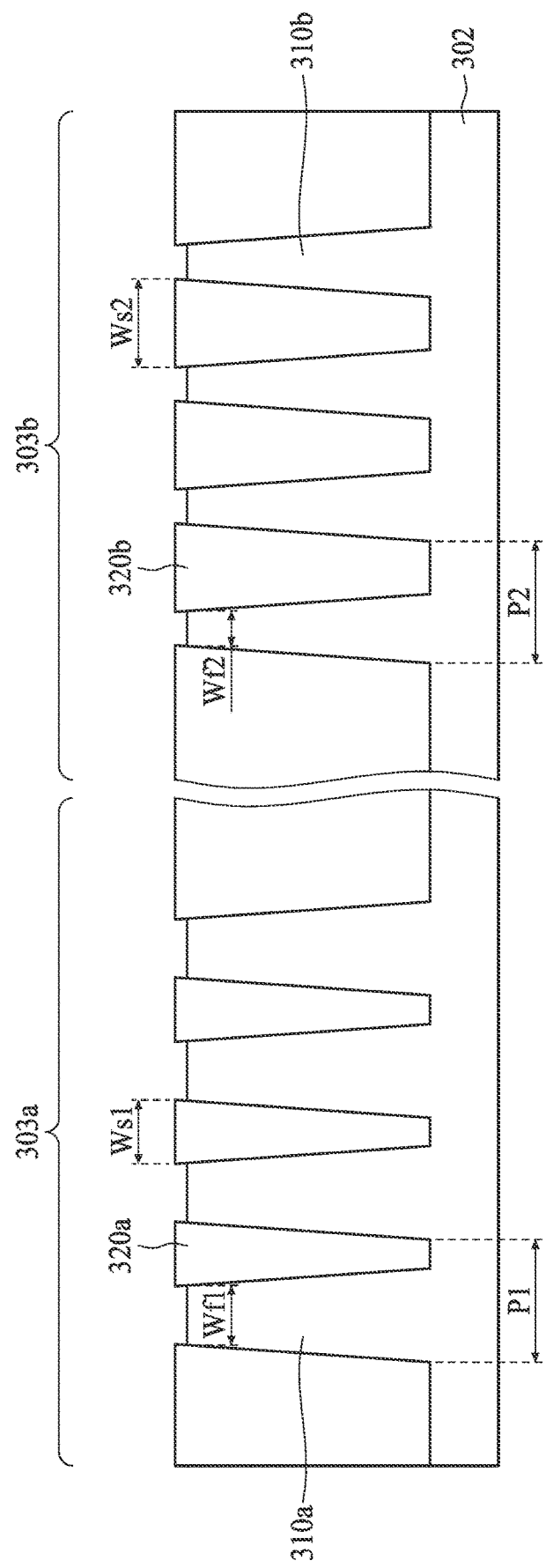

Referring to FIG. 7, in operation 103, isolation structures 320a and 320b are formed over the substrate 302. In some embodiments, operation 202 is similar to operation 103. In such embodiments, portions of the isolation structure 320a disposed between the first fins 310a are referred to as first isolation structures 320a, and portions of the isolation structure 320b disposed between the second fins 310b are referred to as second isolation structures 320b. It should be noted that a width Ws1 of the first isolation structure 320a is less than a width Ws2 of the second isolation structure 320b.

The first and second isolation structures 320a and 320b include dielectric materials such as silicon oxide, silicon nitride, silicon oxynitride, other suitable materials, or combinations thereof. In some embodiments, the first and second isolation structures 320a and 320b are multi-layered structures. The first and second isolation structures 320a and 320b may be deposited by CVD, ALD, or any other suitable technique. A chemical mechanical polishing (CMP) operation may be performed subsequently to remove superfluous dielectric material to expose the pad layer (not shown) over the first and second fins 310a and 310b, and also provide a substantially planar and even surface. In some embodiments, the pad layer may be removed after the CMP operation. In such embodiments, top surfaces of the first fins 310a and top surfaces of the second fins 310b may be lower than a top surface of the first and isolation structures 320a and 320b, as shown in FIG. 7, but the disclosure is not limited thereto.

In some embodiments, one alternative to improve filling pertains to using flowable dielectric materials instead of conventional silicon oxide as deposited. Flowable dielectric materials, as their name suggest, can "flow" during deposition to fill voids in a gap. Usually, various chemicals are added to the silicon-containing precursors to allow a deposited film to flow. In some embodiments, nitrogen hydride bonds are added. Examples of flowable dielectric precursors, particularly flowable silicon oxide precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). Such flowable silicon oxide materials are formed in a multiple-operation process. After the flowable film is formed, it is cured and annealed to remove undesired element(s), such as solvent, to form silicon oxide.

In some embodiments, after the removing of the pad layer, a sacrificial layer (not shown) may be formed over the top surfaces of the first and second fins 310a and 310b. In such embodiments, the sacrificial layer may include silicon oxide, but the disclosure is not limited thereto.

Figure 8:
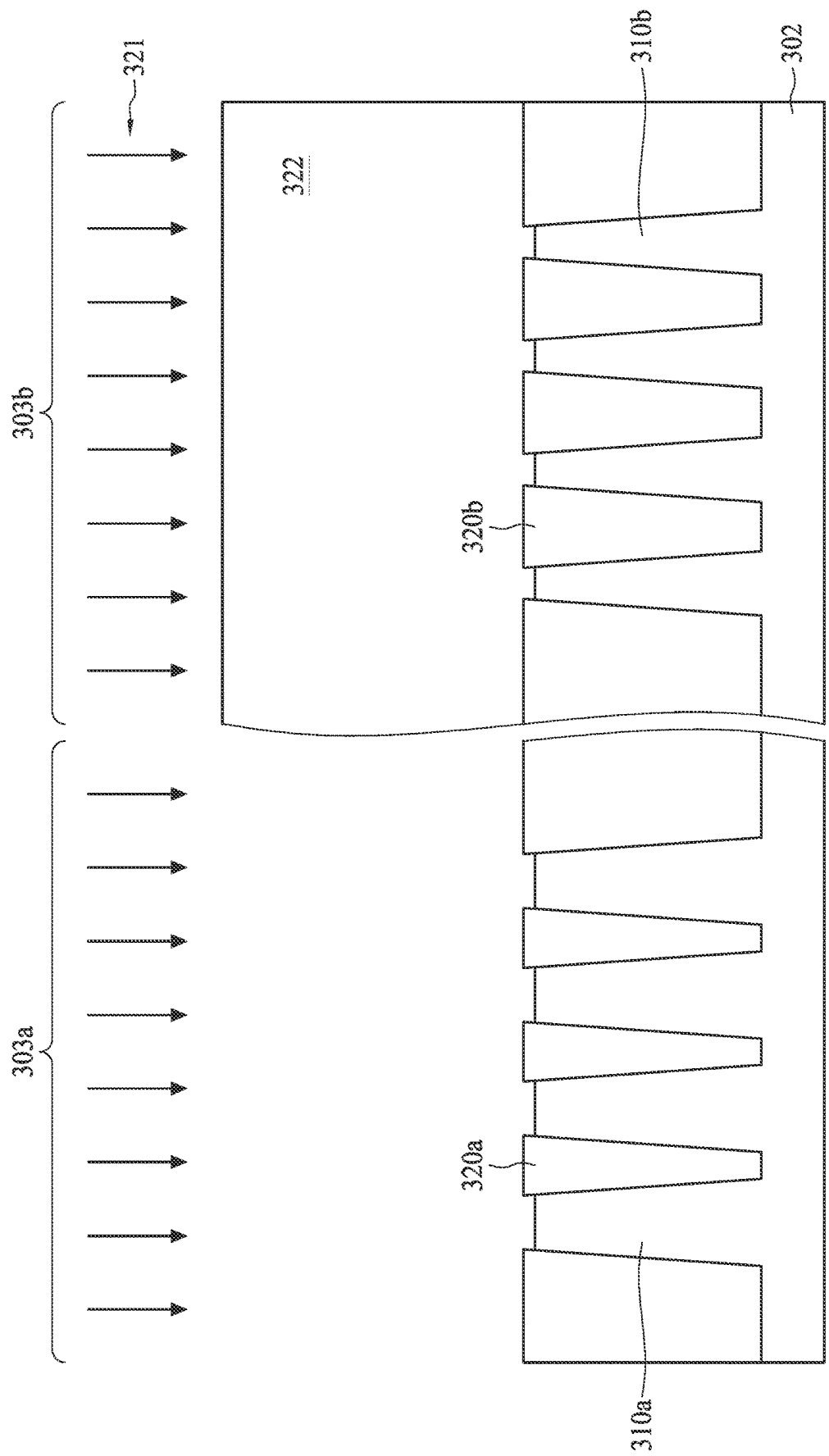

Referring to FIG. 8, in operation 104, an ion implantation 321 is performed. In some embodiments, operation 203 is similar to operation 104. In such embodiments, a protection layer 322 is formed in the second region 303b to cover the second fins 310b. Thus, the second fins 310b are protected from the ion implantation 321 by the protection layer 322. The ion implantation 321 is performed to implant dopants into the first fins 310a. The dopants include a conductivity type such as, for example but not limited therefore, an n type. In such embodiments, the dopants may include arsenic (As) or phosphorous (P) ions, but the disclosure is not limited thereto. In some embodiments, a dosage of the dopants used in the ion implantation 321 is greater than 1E16 ions/cm². For example but not limited thereto, the dosage may be between approximately 1E16 ions/cm² and approximately 2E16 ions/cm². In some embodiments, an energy of the ion implantation 321 is between approximately 7,000 eV and approximately 45,000 eV, but the disclosure is not limited thereto. In some embodiments, the dopants implanted into the first fins 310a adjust a conductivity of the first fins 310a. In some embodiments, the dopants implanted into the first fins 310a cause the semiconductor materials of the first fins 310a to have a metal-like conductivity.

Figure 9:
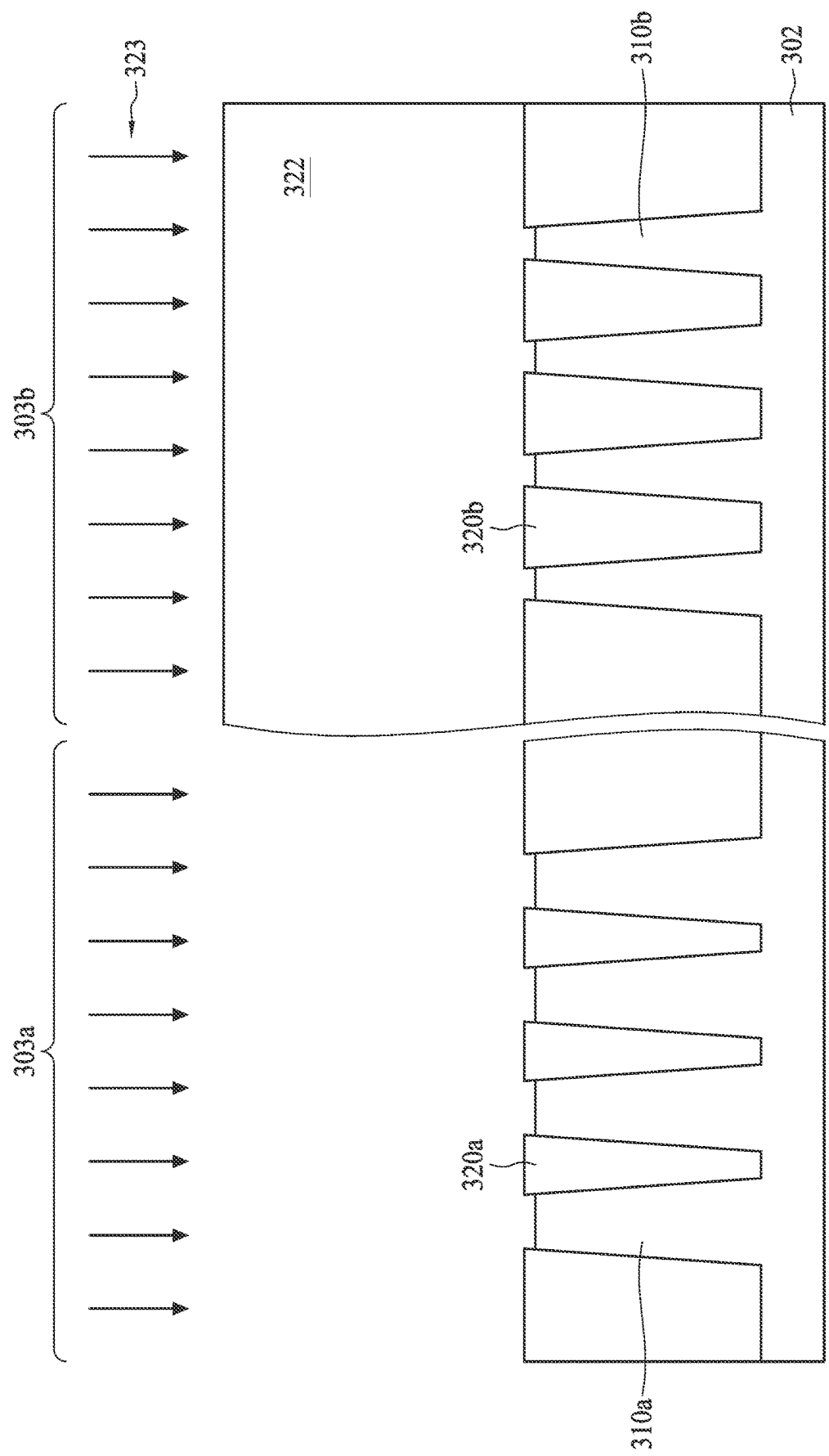

In some embodiments, other ion implantations can be performed on the first fins 310a. Referring to FIG. 9, for example, an ion implantation 323 is performed on the first fins 310a, and the second fins 310b are protected from the ion implantation 323 by the protection layer 322. The ion implantation 323 is performed to implant dopants into the substrate 302 in the first region 303a. In some embodiments, the dopants used in the ion implantation 323 include a conductivity type complementary to that of the dopants used in the ion implantation 321. For example, when the dopants used in the ion implantation 321 are n-type, the dopants used in the ion implantation 323 are p-type. For example but not limited thereto, the dopants used in the ion implantation 323 may include boron (B) ions. In some embodiments, a dosage of the dopants used in the ion implantation 323 is greater than approximately 5E13 ions/cm². In some embodiments, the dosage may be equal to or greater than 1E14 ions/cm². In some embodiments, an energy of the ion implantation 323 is between approximately 20,000 eV and approximately 40,000 eV, but the disclosure is not limited thereto. In such embodiments, the dopants implanted into the substrate 302 in the first region 303a provide a function of electrical isolation for the to-be-formed 3D capacitor. The dopants also help mitigate a leakage issue.

In some embodiments, a co-implant may be performed. The co-implant is performed to implant dopants such as, for example but not limited thereto, fluoride (F) or carbon (C) ions into the first fins 310a. In some embodiments, a dosage of the dopants used in the co-implant is between approximately 5E13 ions/cm² and approximately 1E14 ions/cm². In some embodiments, an energy of the co-implant is between approximately 1,000 eV and approximately 30,000 eV, but the disclosure is not limited thereto. In such embodiments, the dopants co-implanted into the first fins 310a help to retard junctions. The dopants also help mitigate a diffusion issue of the dopants implanted in the first fins 310a using the ion implantations 321 and 323.

Additionally, the protection layer 322 may be removed after the co-implant, but the disclosure is not limited thereto.

Figure 10:
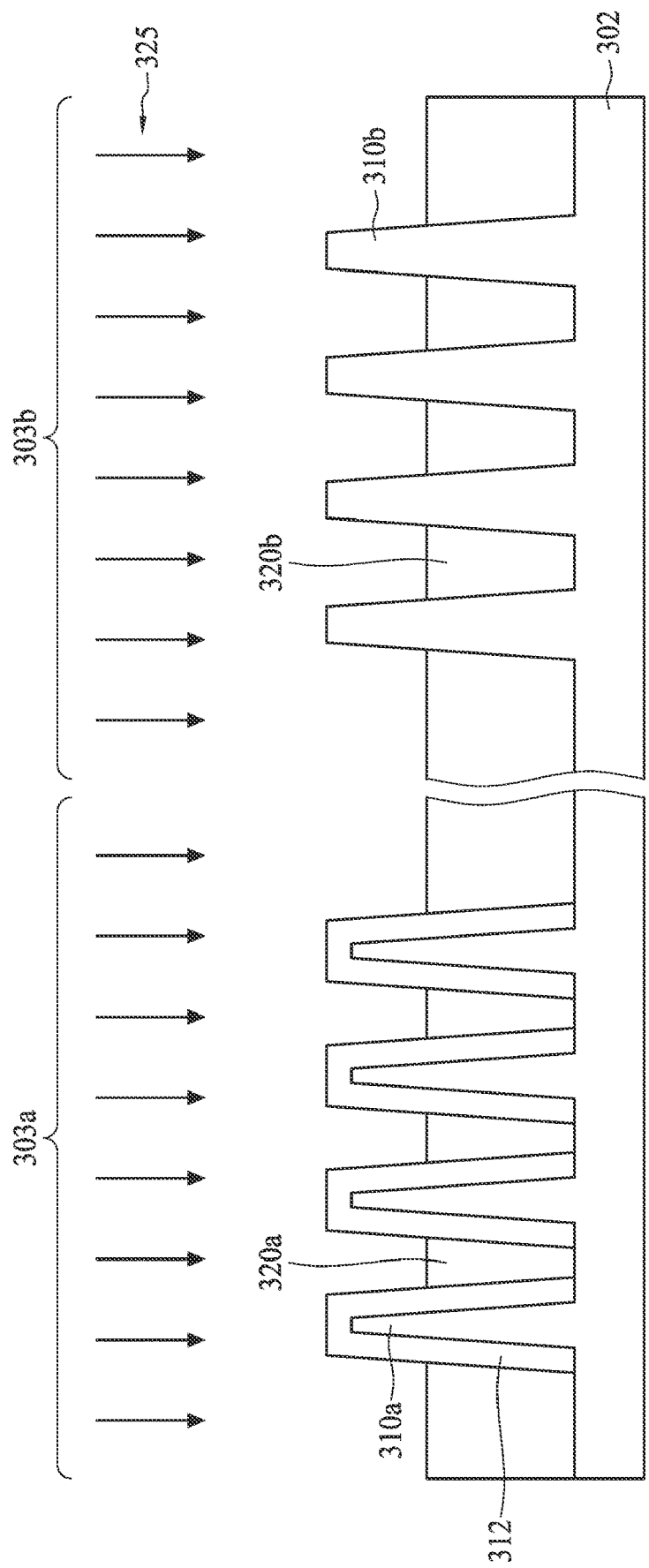

Referring to FIG. 10, in some embodiments, a thermal operation 325 is performed. It has been found that a lattice structure of the first fins 310a may be damaged by the ion implantations 321 and 323 and the co-implant. The thermal operation 325 is performed to repair the damage and to drive-in the dopants into the first fins 310a and the substrate 302. In some embodiments, a temperature of the thermal operation 325 may be between approximately 1000° C. and approximately 1100° C., but the disclosure is not limited thereto. In some embodiments a duration of the thermal operation 325 is between approximately 1 second and approximately 10 seconds, but the disclosure is not limited thereto.

Still referring to FIG. 10, the dopants implanted into the first fins 310a by the ion implantation 321 are driven-in to the first fins 310a. Consequently, a doped region 312 is formed in each first fin 310a. In some embodiments, the doped region 312 may be formed near a surface of the first fin 310a. A concentration of the dopants may decrease in a gradient from the doped region 312 to a center of the first fin 310a.

Figure 11:
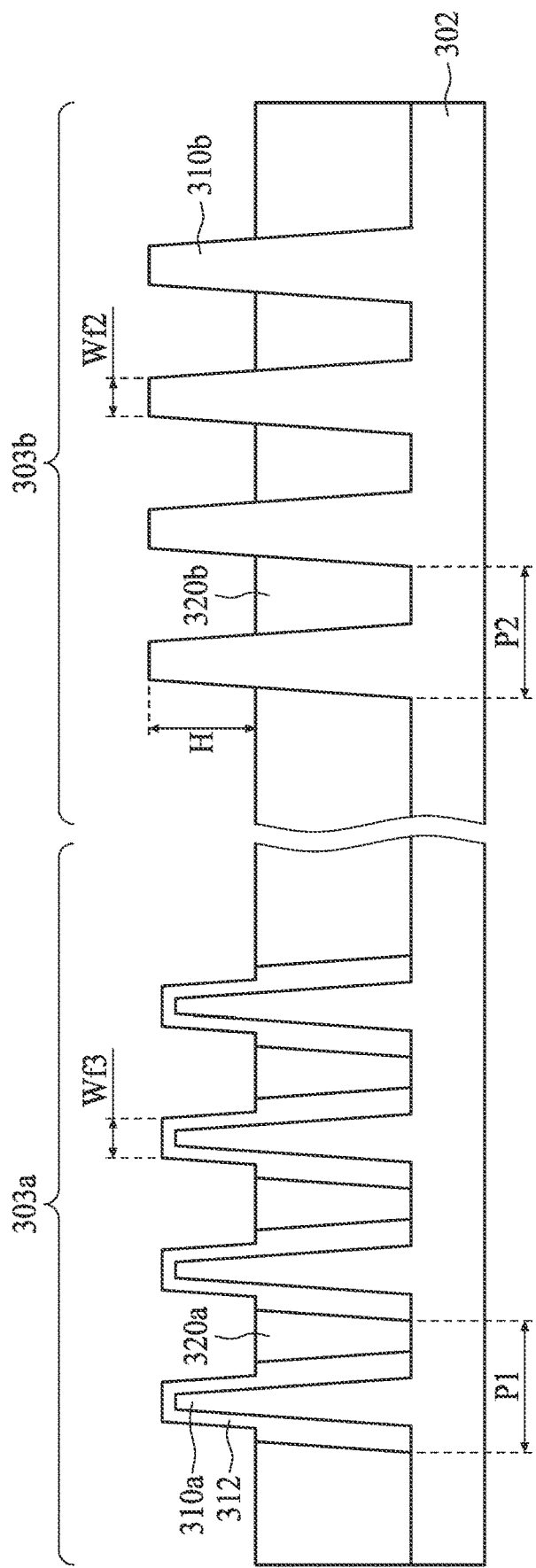

Referring to FIG. 11, in operation 105, a portion of the isolation structures 320a and 320b are removed. In some embodiments, operation 204 is similar to operation 105. In such embodiments, the first and second isolation structures 320a and 320b are recessed to expose a portion of each first fin 310a and a portion of each second fin 310b. In some embodiments, the recessing operation may include a dry etching, a wet etching and/or a combination thereof. By the recessing of the first and second isolation structures 320a and 320b, a portion of the first isolation structure 320a around the first fins 310a and a portion of the second isolation structure 320b around the second fins 310b are removed to laterally expose an upper portion of each first fin 310a and an upper portion of each second fin 310b. Thicknesses of the first and second isolation structures 320a and 320b are thereby reduced. In some embodiments, a recessing depth is controlled (e.g., by controlling an etching time) so as to obtain a desired height H of the first and second fins 310a and 310b.

As mentioned above, the lattice structure of the first fins 310a may be damaged by the ion implantations 321 and 323 and the co-implant. Although the thermal operation 325 helps to repair the lattice structure, the first fins 310a are relatively more vulnerable than the second fins 310b during the recessing of the first and second isolation structures 320a and 320b. Consequently, the first fins 310a may have widths Wf3. In some embodiments, the widths Wf3 of the first fins 310a are less than the widths Wf2 of the second fins 310b after recessing of the first and second isolation structures 320a and 320b. However, in some alternative embodiments, the widths Wf3 of the first fins 310a may be equal to the widths Wf2 of the second fins 310b after the recessing of the first and second isolation structures 320a and 320b.

Additionally, a height of the first fins 310a may also be affected. Thus, the height of the first fins 310a may be less than the desired height H, and less than a height of the second fins 310b.

According to the method 20, the first fins 310a and the second fins 310b are obtained. The thermal operation 325 may help to repair the damaged first fins 310a; therefore, fin consumption during the recessing of the first and second isolation structures 320a and 320b is mitigated. More important, because the widths Wf1 of the first fins 310a are greater than the widths Wf2 of the second fins 310b, consumption during the recessing of the first and second isolation structures 320a and 320b can be compensated. Accordingly, the widths Wf3 of the first fins 310a are equal to or less than the widths Wf2 of the second fins 310b. In other words, the width mismatch issue is mitigated.

As mentioned above, the ratio of the width Wf1 of the first fin 310a to the width Wf2 of the second fin 310b is between approximately 1.1 and approximately 2. In some comparative approaches, when the ratio is less than approximately 1.1, the compensation is not equivalent to the fin consumption. In some alternative comparative approaches, when the ratio is greater than approximately 2, a loading effect may occur.

Figure 12:
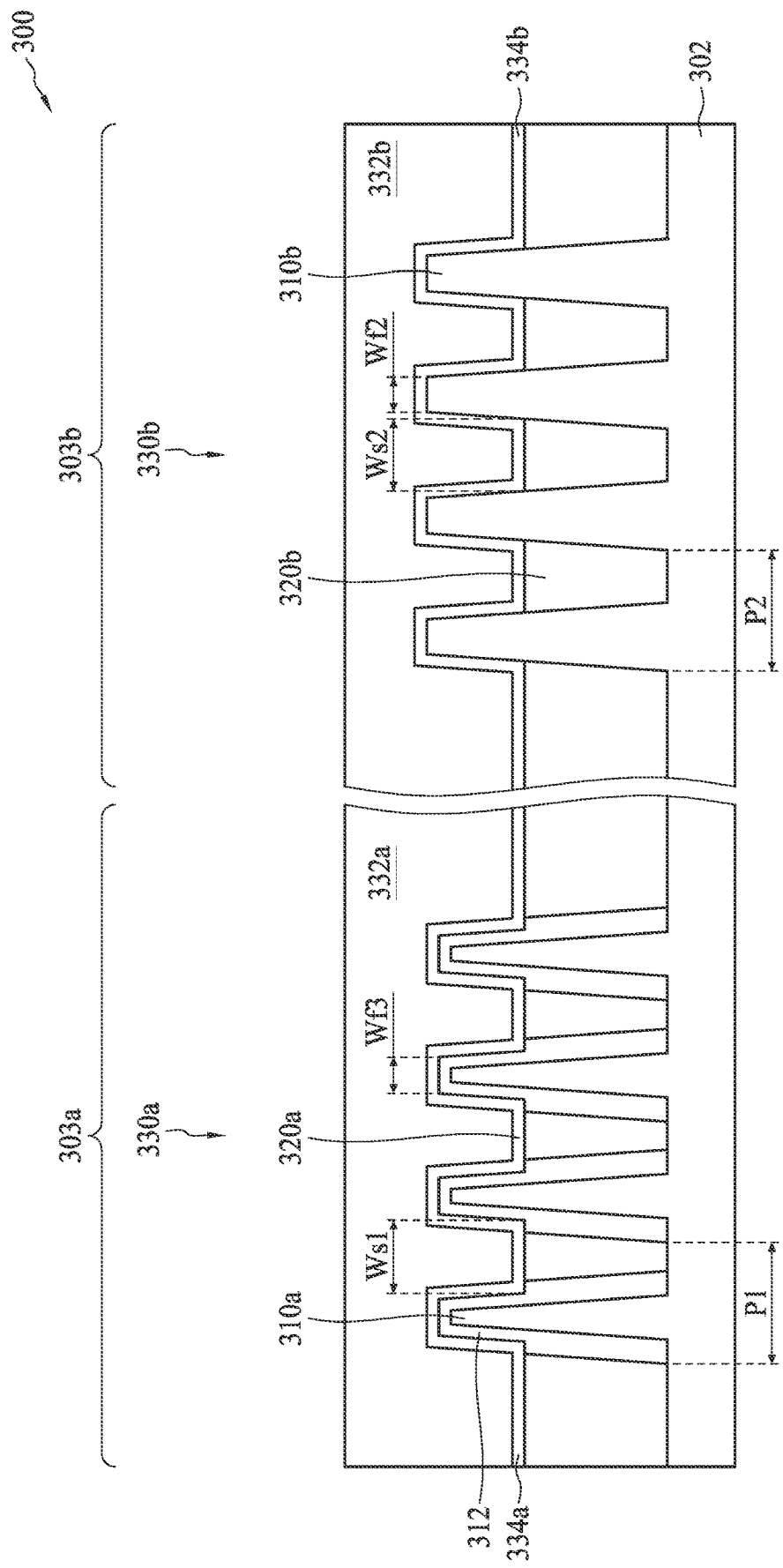

Referring to FIG. 12, in some embodiments, in operation 106, a 3D capacitor 330a is formed in the first region 303a, and a FinFET device 330b is formed in the second region 303b. As shown in FIG. 12, the 3D capacitor 330a includes the first fins 310a, and the FinFET device 330b includes the second fins 310b. Accordingly, a semiconductor structure 300 including the 3D capacitor 330a and the FinFET device 300b is obtained. In some embodiments, the forming of the 3D capacitor 330a and the forming of the FinFET device 330b can be integrated. Further, as mentioned above, the widths Wf3 of the first fins 310a are equal to or less than the widths Wf2 of the second fins 310b. It should be noted that in the 3D capacitor 330a, the doped region 312 functions as a doped electrode of the capacitor. Because the 3D capacitor 330a including the first fins 310s serves as the electrode, the 3D capacitor 330a is also referred to as a FinFET capacitor.

Accordingly, the FinFET capacitor 330a includes a capacitor electrode 332a covering the first fins 310a in the first region 302a, and a capacitor dielectric layer 334a between the first fins 310a and the capacitor electrode 332a. The FinFET device 330b includes a gate electrode 332b covering the second fins 310b, and a gate dielectric layer 334b between the second fins 310b and the gate electrode 332b.

In some embodiments, the capacitor dielectric layer 334a and the gate dielectric layer 334b include a same material, but the disclosure is not limited thereto. In some embodiments, the capacitor dielectric layer 334a and the gate dielectric layer 334b may include silicon oxide, silicon nitride, silicon oxy-nitride, or high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and combinations thereof. In the present embodiment, the capacitor dielectric layer 334a and the gate dielectric layer 334b are high-k dielectric layers including HfOx. The capacitor dielectric layer 334a and the gate dielectric layer 334b may be formed using a suitable process such as ALD, CVD, PVD, thermal oxidation, UV-ozone oxidation, or a combination thereof. The capacitor dielectric layer 334a and the gate dielectric layer 334b may further include an interfacial layer (IL) (not shown) to reduce damage to the capacitor dielectric layer 334a, the substrate 302 and/or the first fins 310a. Similarly, the gate dielectric layer may further include an IL between the gate dielectric layer 334b and the substrate 302, and/or the second fins 310b. The IL may include silicon oxide, but the disclosure is not limited thereto.

In some embodiments, the capacitor electrode 332a and the gate electrode 332b include a same material. In some alternative embodiments, the capacitor electrode 332a and the gate electrode 332b may include different materials. In some embodiments, the capacitor electrode 332a and the gate electrode 332b may both include a work function metal layer and a gap-filling metal layer, but the disclosure is not limited thereto. In some embodiments, a thickness of the capacitor electrode 332a and a thickness of the gate electrode 332b may be similar, but the disclosure is not limited thereto. In some embodiments, the dopants in the first fins 310a implanted by the ion implantation operation 332 and the co-implant help to mitigate current leakage. In some embodiments, the current leakage issue may be mitigated by 8 orders of magnitude.

The semiconductor structure 300 further includes the isolation structure 320a in the first region 303a and adjacent to the first fins 310a, and the isolation structure 320b in the second region 303b and adjacent to the second fins 310b. As shown in FIG. 12, the width Ws2 of the isolation structure 320b is greater than the width Ws1 of the isolation structure 320a.

The present disclosure provides a semiconductor structure including a 3D capacitor and a FinFET device, a method of manufacturing the same. In some embodiments, the method includes forming fins of different widths for forming the 3D capacitor and the FinFET device. At some stages of the manufacturing process, a width of the fins for forming the 3D capacitor is greater than a width of the fins for forming the FinFET device. Accordingly, consumption of the fins of the 3D capacitor during the manufacturing processes is compensated by the wider fin. Due to the compensation of the width of the fins of the 3D capacitor, capacitance of the 3D capacitor is increased without impacting performance of the FinFET device. Further, the method provided by the present disclosure can be easily integrated in FinFET approaches to front-end-of-line (FEOL) manufacturing operations.

According to some embodiments of the present disclosure, a method for forming a semiconductor structure including a 3D capacitor is provided. The method includes following operations. A substrate having a first region and a second region defined therein is received. First fins are formed in the first region, and second fins are formed in the second region. Widths of the first fins are greater than widths of the second fins. An isolation structure is formed over the substrate. A first ion implantation is performed to implant first dopants into the first fins. A portion of the isolation structure is removed to expose a portion of each first fin and a portion of each second fin. The widths of the first fins are equal to or less than widths of the second fins after the removing of the portion of the isolation structure. A 3D capacitor is formed in the first region, and a FinFET device is formed in the second region. The 3D capacitor includes the first fins, and the FinFET device includes the second fins.

According to some embodiments of the present disclosure, a method for forming a semiconductor structure is provided. The method includes following operations. A plurality of first fins and a plurality of second fins are formed over a substrate. The first fins have first widths, and the second fins have second widths. The first widths are greater than the second widths. A first isolation structure is formed between the first fins, and a second isolation structure is formed between the second fins. A width of the first isolation structure is less than a width of the second isolation structure. An ion implantation is performed on the first fins. The first isolation structure and the second isolation structure are recessed to expose a portion of each first fin and a portion of each second fin. The first fins have third widths after the recessing of the first isolation structure and the second isolation structure. The third widths are equal to or less than the second widths.

According to some embodiments of the present disclosure, a semiconductor structure including a 3D capacitor is provided. The semiconductor structure includes a substrate having a first region and a second region defined thereon, a 3D capacitor in the first region, a first isolation structure in the first region, a FinFET device in the second region, and a second isolation structure in the second region. The 3D capacitor includes at least a first fin, and the FinFET device includes at least a second fin. The first isolation structure is adjacent to the first fin, and the second isolation structure is adjacent to the second fin. A width of the second isolation structure is greater than a width of the first isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor structure including a 3D capacitor, comprising:
    receiving a substrate having a first region and a second region;
    forming first fins in the first region and second fins in the second region, wherein widths of the first fins are greater than widths of the second fins;
    forming an isolation structure over the substrate;
    performing a first ion implantation to implant first dopants into the first fins;
    removing a portion of the isolation structure to expose a portion of each first fin and a portion of each second fin; and
    forming a 3D capacitor including the first fins in the first region, and a FinFET device including the second fins in the second region,
    wherein the widths of the first fins are equal to or less than the widths of the second fins after the removing of the portion of the isolation structure.

2. The method of claim 1, wherein a pitch of the first fin is equal to a pitch of the second fin prior to the removing of the portion of the isolation structure.

3. The method of claim 1, further comprising performing a second ion implantation to implant second dopants into the substrate after the first ion implantation.

4. The method of claim 3, wherein a conductivity type of the first dopants and a conductive type of the second dopants are complementary to each other.

5. The method of claim 3, further comprising performing a co-implant to implant third dopants into the substrate.

6. The method of claim 1, further comprising forming a protection layer in the second region prior to the performing of the first ion implantation.

7. The method of claim 1, wherein the forming of the first fins and the second fins further comprises:
    forming a first mandrel in the first region and a second mandrel in the second region;
    forming first spacers over sidewalls of the first mandrel in the first region and second spacers over sidewalls of the second mandrel in the second region, wherein widths of the first spacers and widths of the second spaces are equal;
    removing the first mandrel and the second mandrel;
    trimming the second spacers to reduce the widths of the second spacers; and
    etching the substrate through the first spacers and the trimmed second spacers to form the first fins and the second fins.

8. The method of claim 7, wherein a width of the first mandrel and a width of the second mandrel are different.

9. The method of claim 1, further comprising performing a thermal operation prior to the removing of the portion of the isolation structure.

10. A method for forming a semiconductor structure, comprising:
    forming a plurality of first fins and a plurality of second fins over a substrate, wherein the first fins have first widths, the second fins have second widths, and the first widths are greater than the second widths;
    forming a first isolation structure between the first fins and a second isolation structure between the second fins, wherein a width of the first isolation structure is less than a width of the second isolation structure;
    forming a protection layer over the second fins;
    performing an ion implantation on the first fins after the forming of the protection layer; and
    recessing the first isolation structure and the second isolation structure to expose a portion of each first fin and a portion of each second fin, wherein the first fins have third widths equal to or less than the first widths.

11. The method of claim 10, wherein the third widths of the first fins are equal to or less than the second widths of the second fins.

12. The method of claim 11, wherein a pitch of the first fin is substantially equal to a pitch of the second fin before the recessing of the first isolation structure and the second isolation structure.

13. The method of claim 12, wherein a ratio of the first width of the first fins to the second width of the second fins is between approximately 1.1 and approximately 2.

14. The method of claim 10, wherein a dosage of dopants used in the ion implantation is between approximately 1E16 ion/cm$^2$ and approximately 2E16 ion/cm$^2$.

15. The method of claim 10, wherein an energy of the ion implantation is between approximately 7,000 eV and approximately 45,000 eV.

16. The method of claim 10, further comprising performing a thermal operation after the performing of the ion implantation.

17. A semiconductor structure including a 3D capacitor comprising:
    a substrate having a first region and a second region;
    a 3D capacitor in the first region, wherein the 3D capacitor comprises at least a first fin;
    a first isolation structure in the first region and adjacent to the first fin;
    a FinFET device in the second region, wherein the FinFET device comprises at least a second fin; and
    a second isolation structure in the second region and adjacent to the second fin,
    wherein a width of the second isolation structure is greater than a width of the first isolation structure.

18. The semiconductor structure of claim 17, wherein a width of the first fin is equal to or less than a width of the second fin.

19. The semiconductor structure of claim 17, wherein the 3D capacitor further comprises a doped electrode in the first fin, a capacitor electrode over the first fin, and a capacitor dielectric layer between the doped electrode and the capacitor electrode.

20. The semiconductor structure of claim 17, wherein the FinFET device further comprises a gate electrode over the second fin and a gate dielectric layer between the second fin and the gate electrode.

\* \* \* \* \*